US009318575B2

(12) United States Patent
Jeong et al.

(10) Patent No.: US 9,318,575 B2
(45) Date of Patent: Apr. 19, 2016

(54) SEMICONDUCTOR DEVICE AND METHOD FOR FABRICATING THE SAME

(71) Applicant: Samsung Electronics Co., Ltd., Suwon-si (KR)

(72) Inventors: Yeong-Jong Jeong, Yongin-si (KR); Jeong-Yun Lee, Yongin-si (KR); Shi Li Quan, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/313,039

(22) Filed: Jun. 24, 2014

(65) Prior Publication Data
US 2015/0126012 A1    May 7, 2015

(30) Foreign Application Priority Data

Nov. 5, 2013   (KR) .................. 10-2013-0133573

(51) Int. Cl.
*H01L 21/336* (2006.01)
*H01L 29/66* (2006.01)
*H01L 29/78* (2006.01)

(52) U.S. Cl.
CPC .... *H01L 29/66545* (2013.01); *H01L 29/66628* (2013.01); *H01L 29/6653* (2013.01); *H01L 29/6656* (2013.01); *H01L 29/66636* (2013.01); *H01L 29/7848* (2013.01)

(58) Field of Classification Search
USPC ................................. 438/300, 595
See application file for complete search history.

(56) References Cited

U.S. PATENT DOCUMENTS

| 8,765,542 | B1 * | 7/2014 | Patzer et al. ............... 438/199 |
|---|---|---|---|
| 2004/0132272 | A1 | 7/2004 | Ku et al. |
| 2006/0154423 | A1 | 7/2006 | Fried et al. |
| 2007/0023791 | A1 | 2/2007 | Kim et al. |
| 2007/0057325 | A1 | 3/2007 | Hsu et al. |
| 2008/0217685 | A1 | 9/2008 | Kim |
| 2009/0026552 | A1 | 1/2009 | Zhang et al. |
| 2011/0171794 | A1 | 7/2011 | Seo et al. |
| 2012/0223364 | A1 * | 9/2012 | Chung et al. ............... 257/192 |
| 2013/0071980 | A1 | 3/2013 | Lin et al. |
| 2013/0102116 | A1 | 4/2013 | Xiao et al. |

FOREIGN PATENT DOCUMENTS

| KR | 2007000758 | 1/2007 |
|---|---|---|
| KR | 2009016858 | 2/2009 |
| KR | 2009067511 | 6/2009 |
| KR | 2009068777 | 6/2009 |

* cited by examiner

Primary Examiner — Timor Karimy
(74) Attorney, Agent, or Firm — Onello & Mello LLP

(57) ABSTRACT

A method of forming a semiconductor device includes forming a gate structure including a polysilicon gate and forming a capping spacer on a side surface of the gate structure to prevent parasitic epitaxial growth on the side surface of the polysilicon gate.

19 Claims, 23 Drawing Sheets

SEMICONDUCTOR DEVICE AND METHOD FOR FABRICATING THE SAME

CROSS-REFERENCE TO RELATED APPLICATIONS

This application is based on and claims priority from Korean Patent Application No. 10-2013-0133573, filed on Nov. 5, 2013 in the Korean Intellectual Property Office, the disclosure of which is incorporated herein in its entirety by reference.

BACKGROUND

1. Field of the Invention

Inventive concepts relate to a semiconductor device and a method for fabricating the same.

2. Description of the Prior Art

A multi-gate transistor, in which a fin-type silicon body is formed on a substrate and a gate is formed on a surface of the silicon body has been proposed as a method of increasing the density of semiconductor devices.

Because a multi-gate transistor may use a three-dimensional (3D) channel, scaling can be performed and current control capability may be improved even without increasing a gate length of the multi-gate transistor. In addition, a short channel effect (SCE) in which an electric potential of a channel region is affected by a drain voltage can be effectively suppressed.

SUMMARY

A method of fabricating a semiconductor device in accordance with principles of inventive concepts includes forming a gate structure, in which a polysilicon gate and a hard mask are stacked and which includes an upper portion and a lower portion, on a substrate; forming a gate spacer on a side surface of the gate structure; forming a sacrificial layer, which surrounds a part of the gate spacer and the lower portion of the gate structure, on the substrate; forming a capping spacer on a side surface of the upper portion of the gate structure that projects beyond the sacrificial layer; and removing the sacrificial layer after forming the capping spacer.

A method of fabricating a semiconductor device in accordance with principles of inventive concepts includes a capping spacer projects farther than a side surface of the gate spacer.

A method of fabricating a semiconductor device in accordance with principles of inventive concepts includes etching at least a part of the projecting capping spacer after removing the sacrificial layer.

A method of fabricating a semiconductor device in accordance with principles of inventive concepts includes the capping spacer formed to extend up to at least a part of a side surface of the polysilicon gate.

A method of fabricating a semiconductor device in accordance with principles of inventive concepts includes forming the capping spacer comprises forming a capping spacer layer on an upper surface of the sacrificial layer and the gate structure; and exposing the sacrificial layer by etching the capping spacer layer.

A method of fabricating a semiconductor device in accordance with principles of inventive concepts includes the capping spacer layer includes at least one of SiO2, SiN, and SiOCN.

A method of fabricating a semiconductor device in accordance with principles of inventive concepts includes forming a recess at each side of the gate spacer in the substrate before forming the sacrificial layer.

A method of fabricating a semiconductor device in accordance with principles of inventive concepts includes a height of the gate structure is higher than a height of the gate spacer.

A method of fabricating a semiconductor device in accordance with principles of inventive concepts includes forming a recess at each side of the gate spacer in the substrate after removing the sacrificial layer.

A method of fabricating a semiconductor device in accordance with principles of inventive concepts includes forming an interlayer insulating layer, which covers the gate structure and the capping spacer, on the substrate after removing the sacrificial layer; exposing the polysilicon gate by planarization of the interlayer insulating layer; forming a trench in the interlayer insulating layer by removing the polysilicon gate; and forming a replacement gate electrode in the trench.

A method of fabricating a semiconductor device in accordance with principles of inventive concepts includes the substrate including a fin-type active pattern that projects above the substrate, and the gate structure is formed on the fin-type active pattern to cross the fin-type active pattern.

A method of fabricating a semiconductor device in accordance with principles of inventive concepts includes a height measured from the substrate to an upper surface of the sacrificial layer is higher than a height measured from the substrate to an upper surface of the fin-type active pattern.

A method of fabricating a semiconductor device in accordance with principles of inventive concepts includes the gate spacer and the hard mask include materials having different etch resistances, and the gate spacer includes SiOCN, and the hard mask includes SiN.

A method of fabricating a semiconductor device in accordance with principles of inventive concepts includes forming a gate structure, in which a polysilicon gate and a hard mask having a width that is larger than a width of the polysilicon gate are stacked, on a substrate; forming a recess at each side of the gate structure, in the substrate; and forming a source/drain in the recess.

A method of fabricating a semiconductor device in accordance with principles of inventive concepts includes forming a gate structure including forming a polysilicon layer and the hard mask on the substrate, and forming the polysilicon gate using the hard mask as a mask in an etching process, wherein the polysilicon gate is undercut toward a lower portion of the hard mask in the etching process.

A method of fabricating a semiconductor device in accordance with principles of inventive concepts includes forming a gate structure including a polysilicon gate; forming gate spacers on the side surfaces of the gate; and forming a capping layer to prevent parasitic epitaxial growth.

A method of fabricating a semiconductor device in accordance with principles of inventive concepts includes performing an epitaxial growth step to form a source/drain region.

A method of fabricating a semiconductor device in accordance with principles of inventive concepts includes gate spacers only partially cover the sides of the polysilicon and the capping layer covers whatever portion of the sides not covered by the gate spacers.

A method of fabricating a semiconductor device in accordance with principles of inventive concepts includes a capping layer formed to prevent exposure of the polysilicon during a subsequent process step.

A method of fabricating a semiconductor device in accordance with principles of inventive concepts includes forming an interlayer insulating layer, which covers the gate structure and the capping spacer, on the substrate after removing the sacrificial layer; exposing the polysilicon gate by planarization of the interlayer insulating layer; forming a trench in the interlayer insulating layer by removing the polysilicon gate; forming a replacement gate electrode in the trench, wherein the substrate includes a fin-type active pattern that projects above the substrate, and the gate structure is formed on the fin-type active pattern to cross the fin-type active pattern.

BRIEF DESCRIPTION OF THE DRAWINGS

The above and other objects, features and advantages in accordance with principles of inventive concepts will be more apparent from the following detailed description taken in conjunction with the accompanying drawings, in which.

DETAILED DESCRIPTION OF THE EMBODIMENTS

Figure 1:
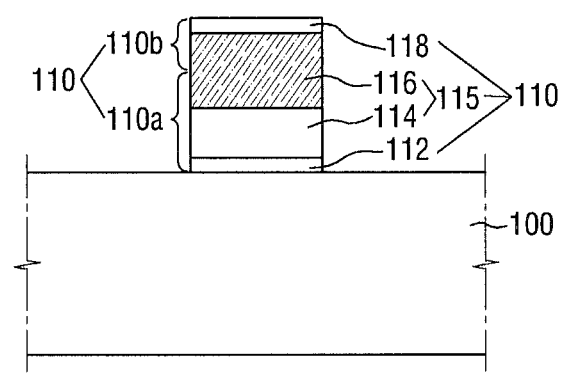
FIGS. 1 to 9 are views of intermediate steps explaining a method for fabricating a semiconductor device according to a first embodiment in accordance with principles of inventive concepts.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments in accordance with principles of inventive concepts will be explained in detail with reference to the accompanying drawings. Hereinafter, referring to FIGS. 1 to 9, a method for fabricating a semiconductor device according to a first exemplary embodiment in accordance with principles of inventive concepts will be described.

FIGS. 1 to 9 are views of intermediate steps explaining a method for fabricating a semiconductor device according to a first embodiment in accordance with principles of inventive concepts.

Referring to FIG. 1, a first gate structure 110, in which a first gate insulating layer 112, a first gate electrode 115, and a first hard mask 118 are stacked, is formed on a substrate 100.

The first gate structure 110 includes a lower portion 110a of the first gate structure and an upper portion 110b of the first gate structure. The lower portion 110a of the first gate structure includes the first gate insulating layer 112 and a part of the first gate electrode 115. The upper portion 110b of the first gate structure includes the remaining portion of the first gate structure 110 and the first hard mask 118. The basis for dividing the first gate structure 110 into the lower portion 110a of the first gate structure and the upper portion 110b of the first gate structure will be described with reference to FIG. 3.

The insulating layer, the gate electrode layer, and the hard mask layer are sequentially formed on the substrate 100. Through patterning of the hard mask layer, the first hard mask 118 is formed on the substrate 100. The gate electrode layer and the insulating layer are sequentially etched using the first hard mask 118 as an etch mask. Through such a process, the first gate structure 110, which includes the first gate insulating layer 112, the first gate electrode 115, and the first hard mask 118, is formed on the substrate 100.

During a process for etching the first gate electrode 115 and the first gate insulating layer 112, a process for passivating the first gate electrode 115 and the first gate insulating layer 112 may be simultaneously performed. Through such a process, a side surface of the first gate structure 110, which is substantially in parallel to the normal direction of the substrate 100, may be formed. Through passivation of side surfaces of the first gate electrode 115 and the first gate insulating layer 112 during the etching process for forming the first gate structure 110, lateral etching, which etches the side surfaces of the first gate electrode 115 and the first gate insulating layer 112, may be minimized.

In exemplary embodiments in accordance with principles of inventive concepts, the substrate 100 may be made of bulk silicon or SOI (Silicon-On-Insulator), for example. Alternatively, the substrate 100 may be a silicon substrate, or may include another material such as, for example, silicon germanium, indium antimonide, lead telluride, indium arsenide, indium phosphide, gallium arsenide, or gallium antimonide, however exemplary embodiments in accordance with principles of inventive concepts are not limited thereto. In the method for fabricating a semiconductor device according to embodiments in accordance with principles of inventive concepts, it is assumed that the substrate 100 is a silicon substrate.

The first gate insulating layer 112 may be, for example, a silicon oxide layer, a SiON layer, a GexOyNz layer, a GexSiyOz layer, a high-k dielectric layer, a combination thereof, or a stacked layer in which the above-described layers are sequentially stacked. The high-k dielectric layer may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first gate insulating layer 112 may include a first lower gate electrode 114 and a first upper gate electrode 116. The first lower gate electrode 114 may include a metallic material, for example, one of titanium nitride (TiN), tantalum nitride (TaN), titanium (Ti), aluminum (Al), and a combination thereof. The first upper gate electrode 116 may include polysilicon. That is, the first upper gate electrode 116 may be a polysilicon gate.

In the method for fabricating a semiconductor device according to the first embodiment in accordance with principles of inventive concepts, the first gate electrode 115 includes the first lower gate electrode 114 including a metallic material and the first upper gate electrode 116 that is a polysilicon gate, however exemplary embodiments in accordance with principles of inventive concepts are not limited thereto. The first gate electrode 115 may include only the first upper gate electrode 116 that is a polysilicon gate without the first lower gate electrode 114.

The first hard mask 118 may include, for example, one of silicon nitride (SiN), silicon oxide (SiO2), silicon oxynitride (SiON), and a combination thereof.

FIG. 1 illustrates that the lower portion 110a of the first gate structure includes the first gate insulating layer 112, the first lower gate electrode 114, and a part of the first upper gate electrode 116, and the upper portion 110b of the first gate structure includes the remaining portion of the first upper gate electrode 116 and the first hard mask 118. However, this is only for convenience in explanation; configurations of the lower portion 110a and the upper portion 110b of the first gate structure are not limited thereto.

Figure 2:
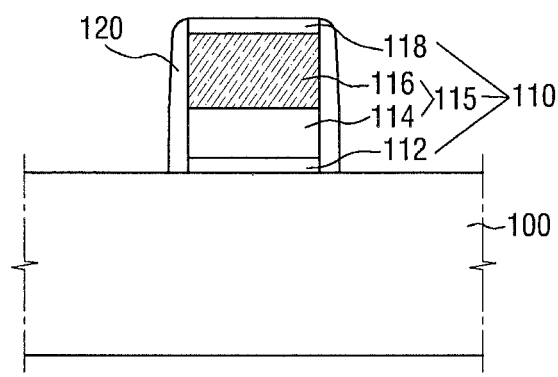

Referring to FIG. 2, a first gate spacer 120 is formed on the side surface of the first gate structure 110.

A gate spacer layer is conformally formed on the substrate 100 on which the first gate structure 110 is formed. Then, the upper surface of the substrate 100 is exposed through etching of the gate spacer layer. Through such a process, the first gate spacer 120 is formed on the side surface of the first gate structure 110.

If the upper surface of the substrate 100 is exposed, the etching process for forming the first gate spacer 120 can be stopped. Accordingly, the height of the first gate spacer 120 that is measured from the upper surface of the substrate 100 may be substantially equal to the height of the first gate structure 110 that is measured from the upper surface of the substrate 100.

In exemplary embodiments in accordance with principles of inventive concepts, first gate spacer 120 includes a material having lower etch resistance than the first hard mask 118. That is, the first gate spacer 120 and the first hard mask 118 include materials having different etch resistances. The first gate spacer 120 may include, for example, SiOCN.

In the method for fabricating a semiconductor device according to the first embodiment in accordance with principles of inventive concepts, the first hard mask 118 includes SiN, and the first gate spacer 120 includes SiOCN.

Figure 3A:
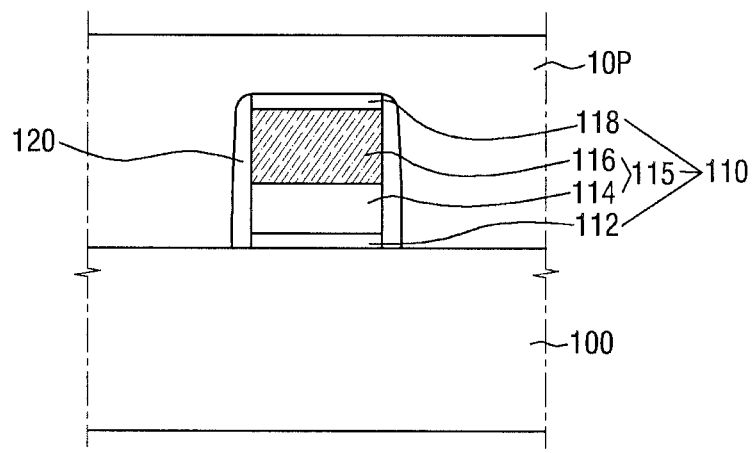
Figure 3B:
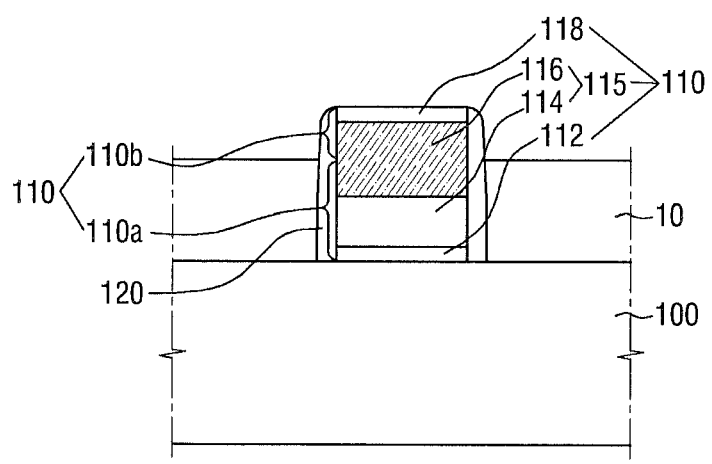

Referring to FIGS. 3A and 3B, a pre-sacrificial layer 10p, which covers the first gate structure 110 and the first gate spacer 120, is formed on the substrate 100.

The pre-sacrificial layer 10p may include a material which has a good gap-filling ability and can minimize damage of the substrate 100 in a subsequent process for removing the sacrificial layer 10. The pre-sacrificial layer 10p may include, for example, SOH (Spin On Hard mask), however exemplary embodiments in accordance with principles of inventive concepts are not limited thereto.

Then, a sacrificial layer 10, which surrounds a part of the first gate spacer 120 and the lower portion 110a of the first gate structure, is formed on the substrate 100.

For example, through the etch back of the pre-sacrificial layer 10p, the first gate structure 110 and the part of the first gate spacer 120 are exposed. Through such a process, the sacrificial layer 10, which surrounds the first gate structure 110 and the part of the first gate spacer 120, is formed.

A portion that is surrounded by the sacrificial layer 10 corresponds to the lower portion 110a of the first gate structure, and a portion that is not surrounded by the sacrificial layer 10 corresponds to the upper portion 110b of the first gate structure.

The upper portion 110b of the first gate structure projects above the sacrificial layer 10. Specifically, the first hard mask 118 and the part of the first upper gate electrode 116 project above the sacrificial layer 10.

Figure 4:
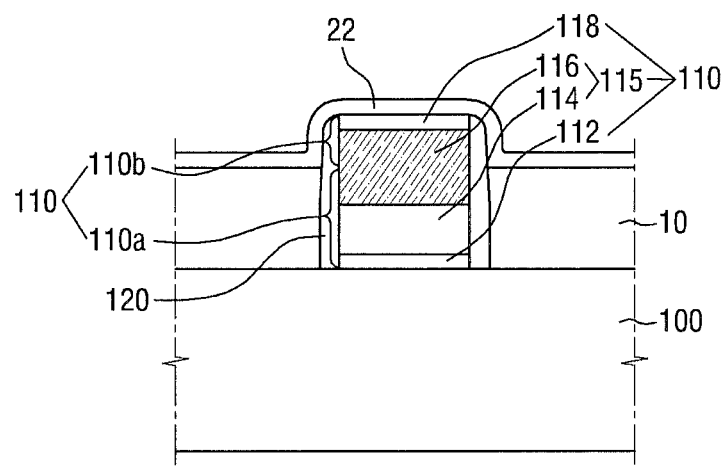

Referring to FIG. 4, in exemplary embodiments in accordance with principles of inventive concepts, a capping spacer layer 22 is formed on the upper surface of the sacrificial layer 10 and the first gate structure 110. In other words, the capping spacer layer 22 is formed on the upper surface of the sacrificial layer 10 and the upper portion 110b of the first gate structure.

The capping spacer layer 22 is formed along the upper surface of the sacrificial layer 10 and the upper portion 110b of the first gate structure. The capping spacer layer 22 may include, for example, at least one of silicon oxide (SiO2), silicon nitride (SiN), and SiOCN.

Figure 5:
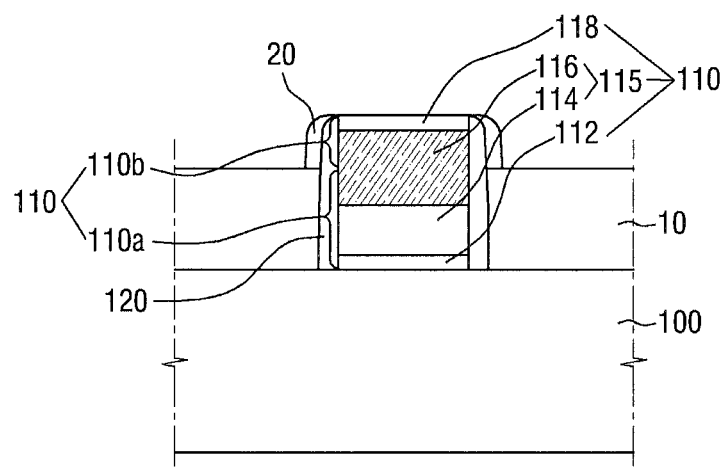

Referring to FIG. 5, a capping spacer 20 is formed on a side surface of the upper portion 110b of the first gate structure that projects above the sacrificial layer 10. Because the lower portion 110a of the first gate structure is surrounded by the sacrificial layer 10, the capping spacer 20 is not formed on the side surface of the lower portion 110a of the first gate structure.

After the capping spacer layer 22 is formed, the upper surface of the sacrificial layer 10 is exposed through etching of the capping spacer 20. Through such a process, the capping spacer 20 is formed on the side surface of the upper portion 110b of the first gate structure. Specifically, the capping spacer 20 is formed on the side surface of the first gate spacer 120.

Figure 6:
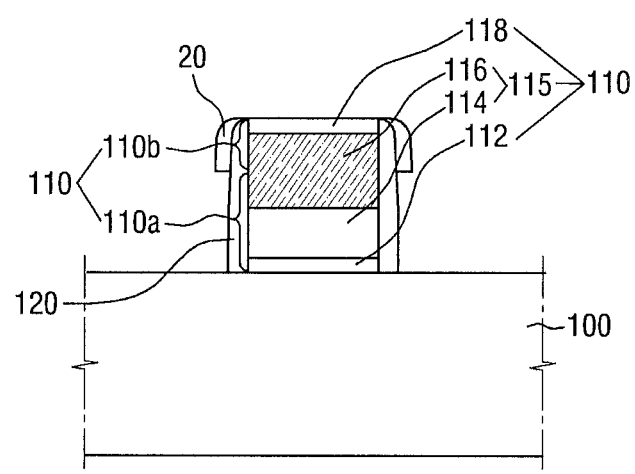

Referring to FIG. 6, in order to form the capping spacer 20 on the side surface of the upper portion 110b of the first gate structure, the sacrificial layer 10 that is formed on the substrate 100 is removed. The substrate 100 is exposed through removal of the sacrificial layer 10.

The sacrificial layer 10 that surrounds the lower portion 110a of the first gate structure may be removed through, for example, an ashing process.

In exemplary embodiments in accordance with principles of inventive concepts, first gate spacer 120 is formed on the side surface of the lower portion 110a of the first gate structure, and the first gate spacer 120 and the capping spacer 20 are sequentially fainted on the side surface of the upper portion 110 of the first gate structure.

The capping spacer 20 projects from the side surface of the first gate structure 110, and specifically, from the side surface of the first gate spacer 120. Accordingly, a space is formed between the substrate 100 and the capping spacer 20.

The capping spacer 20 may be formed to extend from the upper surface of the first hard mask 118 to at least a part of the side surface of the first upper gate electrode 116. That is, the capping spacer 20 may extent up to at least a part of the side surface of the first upper gate structure 116 that is a polysilicon gate.

In exemplary embodiments in accordance with principles of inventive concepts, side surface of the first hard mask 118 entirely overlaps the capping spacer 20. However, the capping spacer 20 may overlap a part of the side surface of the first upper gate electrode 116.

In the method for fabricating a semiconductor device according to the first embodiment in accordance with principles of inventive concepts, the capping spacer 20 is formed to extend up to the first upper gate electrode 116, however exemplary embodiments in accordance with principles of inventive concepts are not limited thereto because it is enough that a space is positioned between the capping spacer 20 and the substrate 100.

Figure 7:
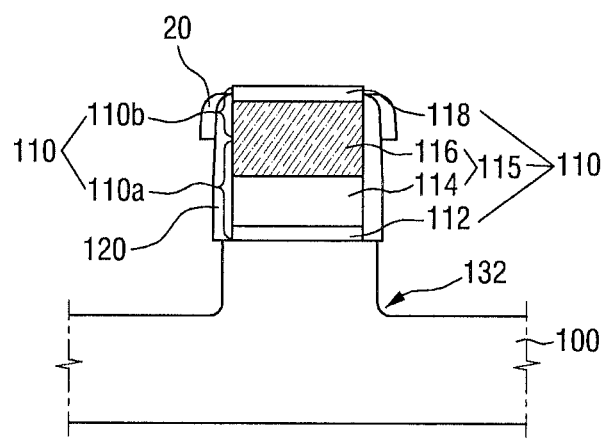

Referring to FIG. 7, a first recess 132 is formed on the side surface of the first gate spacer 120 using the first hard mask 118, the first gate spacer 120, and the capping spacer 20 as masks. The first recess 132 is formed inside the substrate 100.

During an etching process for forming the first recess 132, the first hard mask 118 and a part of the first gate spacer 120 may be etched. In such an embodiment, the first hard mask 118 includes an etch resistant material in comparison to the first gate spacer 120, and thus it may be less etched than the first gate spacer 120. Due to such a difference in etch resistance between the first mask 118 and the first gate spacer 120, the height of the first gate structure 110 may be higher than the height of the first gate spacer 120 after the first recess 132 is formed.

However, because the capping spacer 20 is formed on the side surface of the first gate spacer 120 and, as a result, the layer that is formed on the side surface of the first gate structure 110 has thickened, the etch rate of the first gate spacer 120 can be reduced in the etching process for forming the first recess 132. Accordingly, the first gate spacer 120 overlaps a part of the side surface of the first hard mask 118, but the first gate spacer 120 can entirely cover the side surface of the first upper gate electrode 116 that is the polysilicon gate. That is, in exemplary embodiments in accordance with principles of inventive concepts, the side surface of the first upper gate electrode 116 is not exposed by the etching. By preventing exposure of the side surface of the first upper gate electrode 116 in this manner, a method in accordance with principles of inventive concepts may prevent the unwanted growth of a semiconductor pattern, such as a parasitic pattern which may be referred to herein as a nodule defect, during a subsequent processing step, such as an epitaxial growth step. Such a step may be employed in the formation of a source/drain region, for example. A nodule defect such as may be prevented by a method in accordance with principles of inventive concepts may reduce semiconductor device performance and yield and, by preventing it, a semiconductor device formation method in accordance with principles of inventive concepts may increase both device performance and yield.

At least a part of the capping spacer 20 may be removed by etching in the process for forming the first recess 132. FIG. 7 illustrates that only a part of the capping spacer 20 is removed and the remaining portion remains on a side wall of the first gate spacer 120, however exemplary embodiments in accordance with principles of inventive concepts are not limited thereto.

Figure 8:
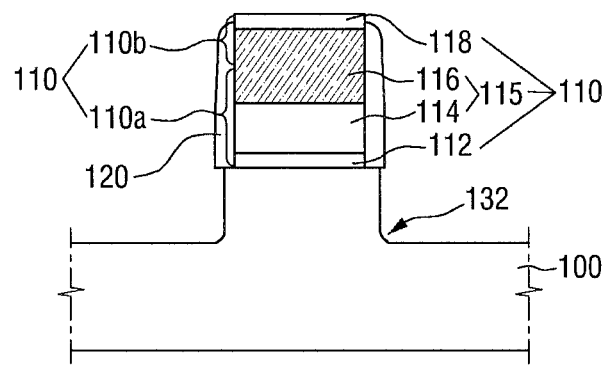

Referring to FIG. 8, at least a part of the capping spacer 20 that projects from the side surface of the first gate spacer 120 may be etched.

Etching of the at least one of the projecting capping spacer 20 may be performed using hydrofluoric acid (HF) or chemical oxide removal (COR), however exemplary embodiments in accordance with principles of inventive concepts are not limited thereto.

The removal of the at least one of the projecting capping spacer 20 may be optional. That is, subsequent processes may be performed without removing the at least one of the projecting capping spacer 20. Additionally, if the entire capping spacer 20 is removed in the process for removing the first recess 132, the above-described process may be avoided.

FIG. 8 illustrates that all the capping spacer 20 remaining on the side surface of the first gate spacer 120 is removed after the process for forming the first recess 132. However, this is only for convenience in explanation, and the removal of the capping spacer 20 is not limited thereto.

Figure 9:
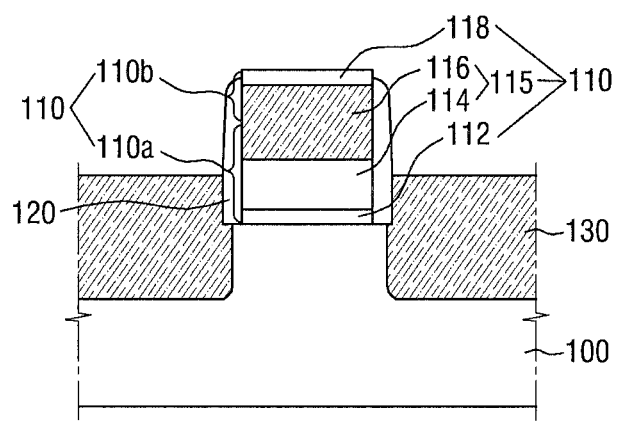

Referring to FIG. 9, a first source/drain 130 may be formed in the first recess 132. The first source/drain 130 is formed on the side surface of the first gate structure 110.

If the transistor is a PMOS transistor, the first source/drain 130 may include a compression stress material. For example, the compression stress material may be a material having higher lattice constant than Si, and may be, for example, SiGe. The compression stress material can improve mobility of carriers in a channel region through applying compression stress to the channel region that is positioned on the lower portion of the first gate insulating layer 112.

Alternatively, if the transistor is an NMOS transistor, the first source/drain 130 may include the same material as the substrate 100 or a tension stress material. For example, if the substrate 100 is made of Si, the first source/drain 130 may include Si or a material having lower lattice constant than Si (e.g., SiC).

The first source/drain 130 may be formed through an epitaxial growth. Additionally, as needed, an impurity may be in-situ doped during the epitaxial growth.

In exemplary embodiments in accordance with principles of inventive concepts, capping spacer 20 protects first gate spacer 120 during an etch process, which, in turn prevents the side surface of the first upper gate electrode 116 from being exposed by the etching. By preventing exposure of the side surface of the first upper gate electrode 116 in this manner, a method in accordance with principles of inventive concepts may prevent the unwanted growth of a nodule defect during a subsequent processing step, such as an epitaxial growth step. Such a step may be employed in the formation of a source/drain region, for example. A nodule defect such as may be prevented by a method in accordance with principles of inventive concepts may reduce semiconductor device performance and yield and, by preventing it, a semiconductor device formation method in accordance with principles of inventive concepts may increase both device performance and yield.

Referring to FIGS. 1 and 10 to 14, a method for fabricating a semiconductor device according to a second embodiment in accordance with principles of inventive concepts will be described. For clarity and brevity, detailed descriptions of elements and processes previously described will not be repeated here.

FIGS. 10 to 14 are views of intermediate steps explaining a method for fabricating a semiconductor device according to a second embodiment in accordance with principles of inventive concepts.

Figure 10:
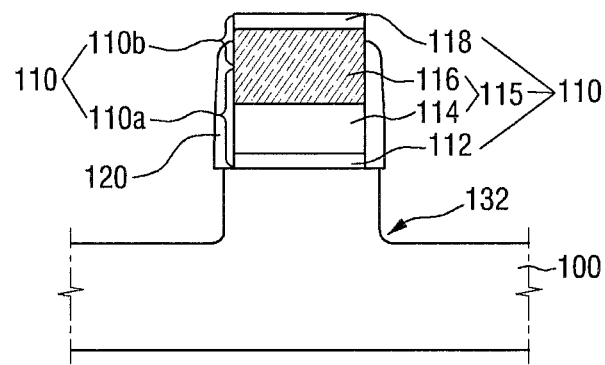
FIGS. 10 to 14 are views of intermediate steps explaining a method for fabricating a semiconductor device according to a second embodiment in accordance with principles of inventive concepts.

Referring to FIG. 10, a first gate spacer 120 is formed on a side surface of a first gate structure 110. Additionally, a first recess 132 is formed on a side surface of the first gate structure 110 in a substrate 100.

In exemplary embodiments in accordance with principles of inventive concepts, a gate spacer layer is formed along an upper surface of the substrate 100 and the first gate structure 110. By performing directional etching of the gate spacer layer, the first gate spacer 120 is formed, and an upper surface of a first hard mask 118 is exposed. Then, by continuing the directional etching, the first recess 132 is formed on the side surface of the first gate structure 110 in the substrate 100. The first gate spacer 120 and the first recess 132 may be simultaneously formed, for example.

In FIG. 10, the height of the first gate spacer 120 that is measured from an upper surface of the substrate 100 may be lower than the height that is measured from the upper surface of the substrate 100 to the upper surface of the first hard mask 118, that is, to the upper surface of the first gate structure 110.

The first gate spacer 120 is formed on the side surface of the first gate structure 110, and the upper surface of the first hard mask 118 is exposed. If the etching process is continuously performed to form the first recess 132 in the substrate 100, the first gate spacer 120 and the first hard mask 118 are continuously etched.

In this case, because the first hard mask 118 includes an etch resistant material in comparison to the first gate spacer 120, the thickness with which the first hard mask 118 is removed becomes lower than the height with which the first gate spacer 120 is removed. Through such a process, the height of the first gate spacer 120 becomes lower than the height of the first gate structure 110.

In FIG. 10, while the first recess 132 is formed, the first gate spacer 120 may be more etched than the first hard mask 118, and as a result a part of a first upper gate electrode 116 may be exposed. The height of the first gate spacer 120 may become lower than a value that is obtained through summation of thicknesses of the first gate insulating layer 112 and the first gate electrode 115. That is, a part of the polysilicon gate may be exposed without being covered by the first gate spacer 120.

If the source/drain is formed on the first recess 132 in a state where the first upper gate electrode 116 that is a polysilicon gate is exposed, a semiconductor pattern may be grown even in the exposed first upper gate electrode 116. This is because the polysilicon gate includes a crystal plane such as single crystal silicon. As described above, an undesirable semiconductor pattern, such as a nodule effect, could be parasitically formed on the first gate structure 110 if the polysilicon were exposed. Such parasitic growth could deteriorate device performance and reduce yield.

Figure 11:
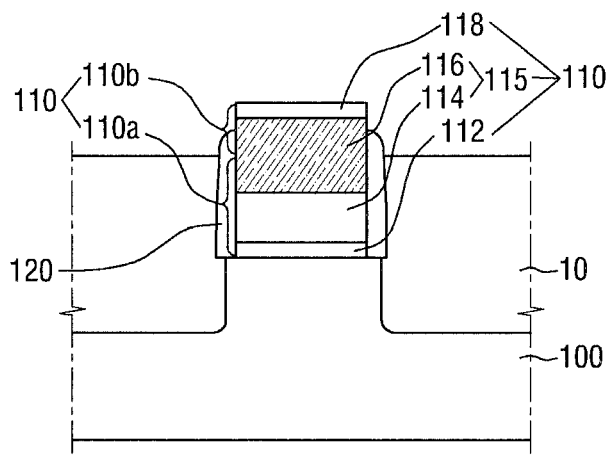

Referring to FIG. 11, a sacrificial layer 10, which surrounds a part of the first gate spacer 120 and a lower portion 110a of the first gate structure, is formed on the substrate 100. Because the first recess 132 is formed in the substrate 100, the sacrificial layer 10 fills the first recess 132.

Because the first gate spacer 120 is formed not only on the side surface of the lower portion 110a of the first gate structure but also on the side surface of the upper portion 110b of the first gate structure, the sacrificial layer 10 does not surround the exposed first upper gate electrode 116. That is, even after the sacrificial layer 10 is formed, a part of the first upper gate electrode 116 may be exposed.

Figure 12:
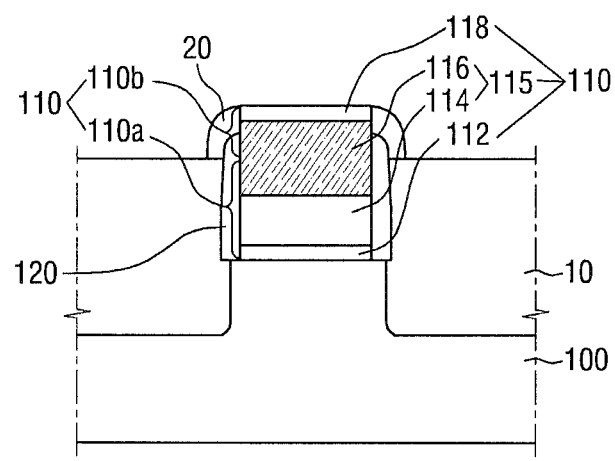

Referring to FIG. 12, a capping spacer 20 is formed on the side surface of the upper portion 110b of the first gate structure that projects above the sacrificial layer 10.

The capping spacer 20 is formed not only on the side surface of the first gate spacer 120 that projects above the sacrificial layer 10 but also on the side surface of the first hard mask 118 that is not covered by the first gate spacer 120 and the side surface of a part of the first upper gate electrode 116.

That is, in exemplary embodiments in accordance with principles of inventive concepts, first gate spacer 120 and the capping spacer 20 are continuously formed on the side surface of the first gate structure 110. Additionally, a part of the first gate spacer 120 and a part of the capping spacer 20 overlap each other. However, as shown in FIG. 5, the capping spacer 20 does not entirely overlap the first gate spacer 120 on the side surface of the first gate structure 110.

In exemplary embodiments in accordance with principles of inventive concepts capping spacer 20 includes a portion that projects farther than the side surface of the first gate spacer 120.

Figure 13:
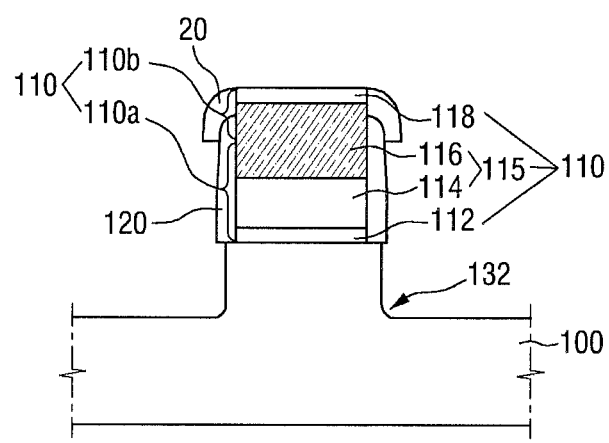

Referring to FIG. 13, the substrate 100 is exposed through removal of the sacrificial layer 10 that surrounds the lower portion 110a of the first gate structure. Because the sacrificial layer 10 is removed, the first recess 132 is exposed.

The sacrificial layer 10 may be removed through, for example, an asking process.

Because the source/drain will be formed in the first recess 132 that is exposed through removal of the sacrificial layer 10, in accordance with principles of inventive concepts, the sacrificial layer 10 may include a material that can minimize damage of the substrate 100.

Figure 14:
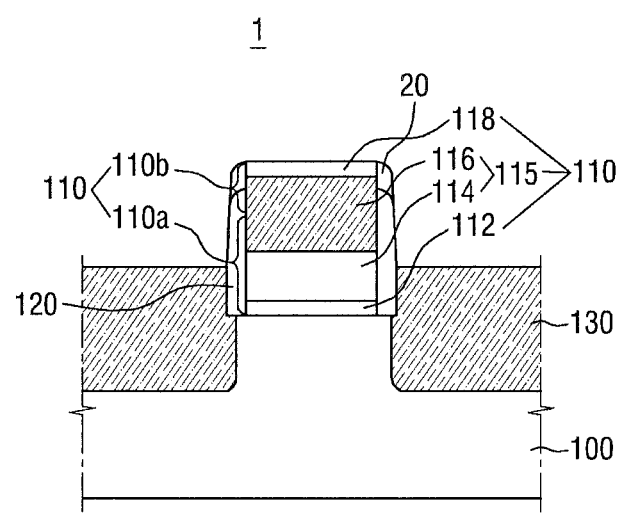

Referring to FIG. 14, the side surface of the first gate spacer 120 and at least a part of the capping spacer 20 that projects from the side surface of the first hard mask 118 may be etched.

Through etching at least a part of the projecting capping spacer 20, the side surface of the capping spacer 20 and the side surface of the first gate spacer 120 may have a continuous profile, for example.

Then, a first source/drain 130 may be formed in the first recess 132. The first source/drain 130 is formed on the side surface of the first gate structure 110.

Referring to FIG. 14, a semiconductor device that is fabricated according to the second embodiment in accordance with principles of inventive concepts will be described. Semiconductor device 1 includes a first gate electrode 115, mask patterns 20 and 118, a first gate spacer 120, a first recess 132, and a first source/drain 130.

The first gate electrode 115 is formed on a substrate 200. Specifically, the first gate electrode 115 is formed on a first gate insulating layer 112. The first gate electrode 115 includes a first upper gate electrode 116 that is a polysilicon gate. That is, the polysilicon gate 116 is formed on the substrate 100.

The mask patterns 20 and 118 are formed on the first gate electrode 115. The mask patterns 20 and 118 are formed on the first upper gate electrode 116 that is the polysilicon gate. The width of the mask patterns 20 and 118 is larger than the width of the first upper gate electrode 116 that is positioned on the lower portion of the mask patterns.

In the semiconductor device according to the second embodiment in accordance with principles of inventive concepts, the mask patterns 20 and 118 may include a first portion and a second portion. The width of the first portion 118 of the mask pattern is substantially equal to the width of the first upper gate electrode 116 that is positioned on the lower portion of the mask patterns 20 and 118.

The second portion 20 of the mask pattern is formed on the side surface of the first portion 118 of the mask patterns 20 and 118. That is, the second portion 20 of the mask pattern projects from the side surface of the first upper gate electrode 116 that is the polysilicon gate.

The first recess 132 is formed on both sides of the first upper gate electrode 116 and in the substrate 100.

The first source/drain 130 is formed in the first recess 132, and may protrude farther than the upper surface of the substrate 100.

In exemplary embodiments in accordance with principles of inventive concepts, by preventing exposure of the side surface of the first upper gate electrode 116, a method in accordance with principles of inventive concepts may prevent the unwanted growth of a parasitic epitaxial growth during formation of a source/drain region, for example. A nodule defect such as may be prevented by a method in accordance with principles of inventive concepts may reduce semiconductor device performance and yield and, by preventing it, a semiconductor device formation method in accordance with principles of inventive concepts may increase both device performance and yield.

Referring to FIGS. 15 to 19, a method for fabricating a semiconductor device according to a third embodiment in accordance with principles of inventive concepts will be described. For clarity and brevity, detailed descriptions of elements and processes previously described will not be repeated here.

FIGS. 15 to 19 are views of intermediate steps explaining a method for fabricating a semiconductor device according to a third embodiment in accordance with principles of inventive concepts.

Figure 15:
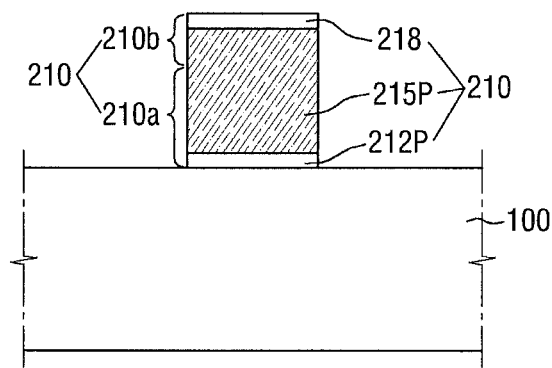
FIGS. 15 to 19 are views of intermediate steps explaining a method for fabricating a semiconductor device according to a third embodiment in accordance with principles of inventive concepts.

Referring to FIG. 15, a second gate structure 210, in which a first dummy gate insulating layer 212p, a first dummy silicon gate 215p, and a second hard mask 218 are stacked, is formed on a substrate 100.

The second gate structure 210, unlike the first gate structure 110 as described above through FIGS. 1 to 14, may be a mold for subsequently forming a replacement metal gate electrode.

The second gate structure 210 includes a lower portion 210a of the second gate structure and an upper portion 210b of the second gate structure. The lower portion 210a of the second gate structure includes the first dummy gate insulating layer 212p and a part of the first dummy silicon gate 215p, and the upper portion 210b of the second gate structure includes the remaining portion of the first dummy silicon gate 215p and the second hard mask 218.

The first dummy gate insulating layer 212p may include, for example, one of silicon oxide (SiO2), silicon oxynitride (SiON), and a combination thereof.

The first dummy silicon gate 215p may include, for example, polysilicon. The first dummy silicon gate 215p may not be doped with an impurity, or may be doped with an impurity.

The second hard mask 218 may include, for example, silicon nitride (SiN), however exemplary embodiments in accordance with principles of inventive concepts are not limited thereto.

Figure 16:
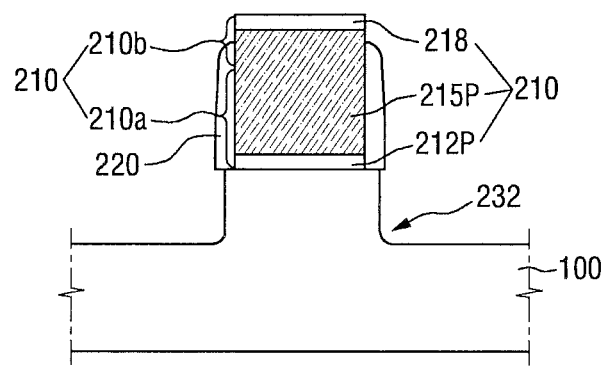

Referring to FIG. 16, a second gate spacer 220 is formed on the side surface of the second gate structure 210. Additionally, a second recess 232 is formed on a side surface of the second gate structure 210 in the substrate 100.

Second gate spacer 220 includes a material having lower etch resistance than the second hard mask 218, and for example, SiOCN that is a low-k material, however exemplary embodiments in accordance with principles of inventive concepts are not limited thereto.

The height of the second gate spacer 220 that is measured from an upper surface of the substrate 100 may be lower than the height that is measured from the upper surface of the substrate 100 to the upper surface of the second hard mask 218, that is, to the upper surface of the second gate structure 210.

A gate spacer layer is formed along the upper surface of the substrate 100 and the second gate structure 210. Through performing directional etching of the gate spacer layer, the upper surface of the substrate 100 and the second hard mask 218 are exposed. Because the second hard mask 218 includes etch resistant material in comparison to the second gate spacer 220, the thickness with which the second hard mask 218 is removed becomes lower than the height with which the second gate spacer 220 is removed in an etching process for forming the second recess 232 after the upper surface of the substrate 100 and the second hard mask 218 are exposed. Through such a process, the height of the second gate spacer 220 becomes lower than the height of the second gate structure 210.

In the method for fabricating a semiconductor device according to the third embodiment in accordance with principles of inventive concepts, second gate spacer 220 does not entirely cover the side surface of the first dummy silicon gate 215p. However, this is only for convenience in explanation, the shape of the second gate spacer 220 is not limited thereto.

Figure 17:
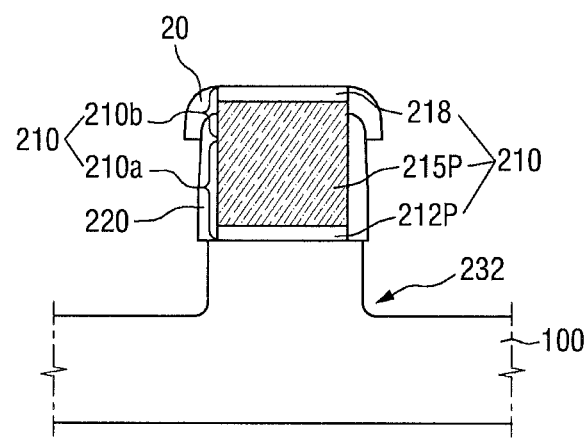

Referring to FIG. 17, a capping spacer 20 is formed on a side surface of the upper portion 210b of the second gate structure.

The capping spacer 20 surrounds the side surface of the second hard mask 218 that is not covered by the second gate spacer 220 and the side surface of the first dummy silicon gate 215p.

A part of the second gate spacer 220 and a part of the capping spacer 20 overlap each other. However, the capping spacer 20 does not entirely overlap the second gate spacer 220 on the side surface of the second gate structure 210.

The capping spacer 20 includes a portion that projects farther than the side surface of the second gate spacer 220.

Specifically, as described above with reference to FIGS. 11 and 12, a sacrificial layer 10, which surrounds a lower portion 210a of the second gate structure, is formed on the substrate 100. Because the second recess 232 is formed in the substrate 100, the sacrificial layer 10 fills the second recess 232. Then, a capping spacer layer is formed along an upper surface of the sacrificial layer 10 and the upper portion 210b of the second gate structure. Thereafter, the capping spacer 20 is formed through etching the capping spacer layer, and the sacrificial layer 10, which surrounds the lower portion 210a of the second gate structure, is removed.

Figure 18:
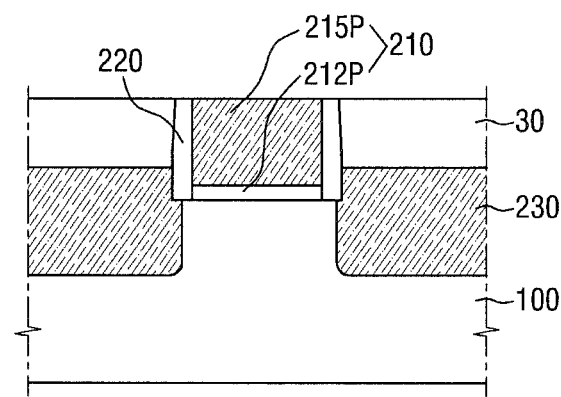

Referring to FIG. 18, a second source/drain 230 is formed in the second recess 232.

Before the second source/drain 230 is formed, at least a part of the portion that projects farther than the side surface of the second gate spacer 220 may be selectively removed.

Then, an interlayer insulating layer 30, which covers the second gate structure 210, the capping spacer 20, and the second source/drain 230, is formed on the substrate 100. The interlayer insulating layer 30 may include, for example, at least one of a low-k material layer, an oxide layer, a nitride layer, and an oxynitride layer. The low-k material may be, for example, FOX (Flowable Oxide), TOSZ (Tonen SilaZen), USG (Undoped Silica Glass), BSG (Borosilica Glass), PSG (PhosphoSilicate Glass), BPSG (BoroPhosphoSilica Glass), PRTEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD), or a combination thereof, however exemplary embodiments in accordance with principles of inventive concepts are not limited thereto.

After the interlayer insulating layer 30 is formed, the interlayer insulating layer 30 is planarized to expose the first dummy silicon gate 215p. That is, the first dummy silicon gate 215p that includes polysilicon is exposed.

By the planarization process for exposing the first dummy silicon gate 215p, the second hard mask 218 and the capping spacer 20 are removed. Additionally, a part of the first dummy silicon gate 215p may also be removed through the planarization process.

Accordingly, in FIG. 18, the capping spacer 20 formed on the side surface of the second gate structure 210 is not illustrated.

Figure 19:
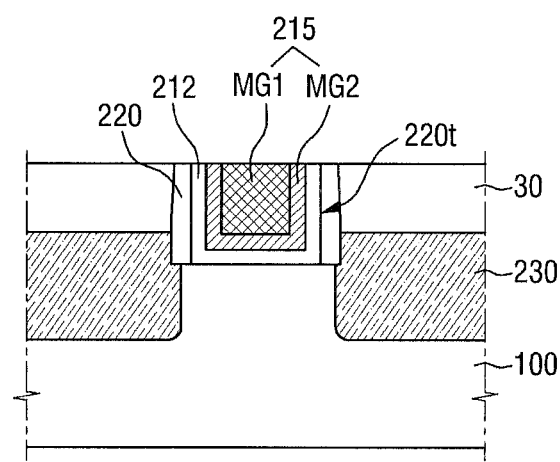

Referring to FIG. 19, a first trench 220t is formed in the interlayer insulating layer 30 through removal of the first dummy silicon gate 215p and the first dummy gate insulating layer 212p.

The first trench 220t is formed on the substrate 100, a bottom surface of the first trench 220t corresponds to the upper surface of the substrate 100, and a side surface of the first trench 220t corresponds to a second gate spacer 220.

Then, a second gate insulating layer 212 and a second gate electrode 215 are formed in the first trench 220t.

The second gate insulating layer 212 may be conformally formed along the side wall and the lower surface of the first trench 220t. The second gate insulating layer 212 may include a high-k dielectric layer having higher dielectric constant than the silicon oxide layer.

The second gate electrode 215 may include metal layers MG1 and MG2. In exemplary embodiments in accordance with principles of inventive concepts, the second gate electrode 215 may be formed by stacking two or more metal layers MG1 and MG2. The first metal layer MG1 may serve to adjust work function, and the second metal layer MG2 may serve to fill a space that is formed by the first metal layer MG1. For example, the first metal layer MG1 may include at least one of TiN, TaN, TiC, and TaC and the second metal layer MG2 may include W or Al. The second gate electrode 215 may be made of Si or SiGe, which is not a metal, for example. The second gate electrode 215 may be, for example, a replacement gate electrode that is formed through a replacement process.

In the method for fabricating a semiconductor device according to the third embodiment in accordance with principles of inventive concepts, the second gate electrode 215 includes the second metal layer MG2 that fills the space that is formed by the first metal layer MG1, however exemplary embodiments in accordance with principles of inventive concepts are not limited thereto. That is, if the width of the first trench 220t, in which the second gate electrode 215 is formed, is narrow, only the first metal layer MG1 may be formed in the first trench 220t in which the second gate insulating layer 212 is formed.

In the method for fabricating a semiconductor device according to the third embodiment in accordance with principles of inventive concepts, the second recess 232 is formed before the capping spacer 20 is formed, however exemplary embodiments in accordance with principles of inventive concepts are not limited thereto. As described above with reference to FIGS. 1 to 9, the second recess 232 may also be formed after the capping spacer 20 is formed.

Referring to FIGS. 20 to 23, a method for fabricating a semiconductor device according to a fourth embodiment in accordance with principles of inventive concepts will be described.

FIGS. 20 to 23 are views of intermediate steps explaining a method for fabricating a semiconductor device according to a fourth embodiment in accordance with principles of inventive concepts.

Figure 20:
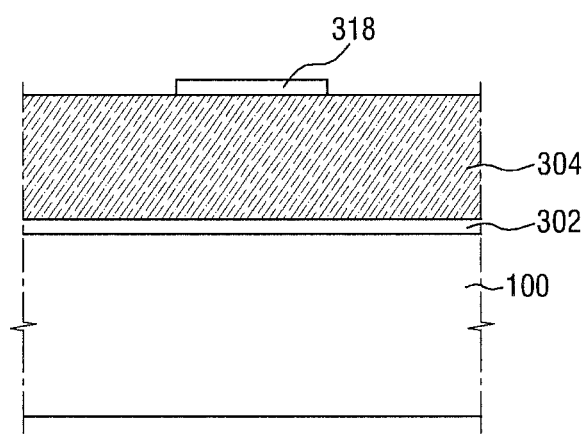
FIGS. 20 to 23 are views of intermediate steps explaining a method for fabricating a semiconductor device according to a fourth embodiment in accordance with principles of inventive concepts.

Referring to FIG. 20, a pre-gate insulating layer 302 and a gate layer 304 are sequentially formed on a substrate 100.

The pre-gate insulating layer 302 may be, for example, a silicon oxide layer, a SiON layer, a GexOyNz layer, a GexSiyOz layer, a high-k dielectric layer, a combination thereof, or a stacked layer in which the above-described layers are stacked in order.

The gate layer 304 may include, for example, polysilicon. FIG. 20 illustrates that the gate layer 304 is a single layer, however exemplary embodiments in accordance with principles of inventive concepts are not limited thereto. That is, a lower portion of the gate layer 304 may include a metal layer, like the first lower gate electrode 112 in FIG. 1, and an upper portion of the gate layer 304 may include a polysilicon layer. Hereinafter, for convenience in explanation, it will be assumed that the gate layer 304 is a single polysilicon layer.

Then, a third hard mask 318 is formed on the gate layer 304. The third hard mask 318 may include, for example, one of silicon nitride (SiN), silicon oxide (SiO2), silicon oxynitride (SiON), and a combination thereof.

Figure 21:
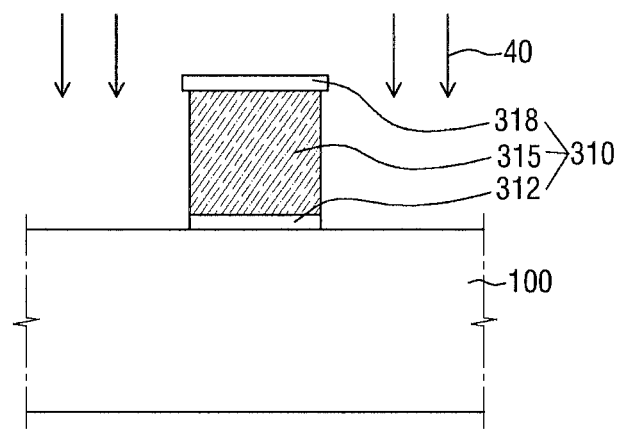

Referring to FIG. 21, a third gate insulating layer 312 and a third gate electrode 315 are formed using the third hard mask 318 as a mask in an etching process. The third gate electrode 315 may be a polysilicon gate, for example.

A third gate structure 310, in which a third gate insulating layer 312, a third gate electrode 315, and a third hard mask 318 are stacked, is formed on the substrate 100.

Although the third hard mask 318 is used as the mask in the etching process 40, the width of the third hard mask 318 is different from the width of the third gate electrode 315.

In particular, in exemplary embodiments in accordance with principles of inventive concepts, the third gate structure 310 that is formed on the substrate 100 includes the third gate electrode 315, and the third hard mask 318 having a width that is larger than the width of the third gate electrode 315. The third gate electrode 315 may entirely overlap the third hard mask 318.

In other words, through the etching process 40 in which the third hard mask 318 is used as the mask, the third gate electrode 315 is undercut toward the lower portion of the third hard mask 318. That is, there is a discontinuity between the side surface profile of the third hard mask 318 and the side surface profile of the third gate electrode 315.

The etching process 40 for forming the third gate structure 310 may be performed under different conditions from those of the etching process for forming the first gate structure 110 in FIG. 1. In particular, in exemplary embodiments in accordance with principles of inventive concepts, the etching process 40 for forming the third gate structure 310 may be an etching process with an enhanced lateral etching as compared with the etching process for forming the first gate structure 110 in FIG. 1. By setting the different conditions from those of the etching process for forming the first gate structure 110 in FIG. 1, the etching process 40 for forming the third gate structure 310 may enhance the lateral etching.

Figure 22:
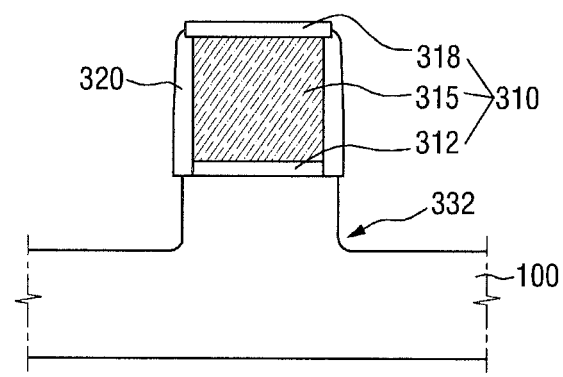

Referring to FIG. 22, a third gate spacer 320 is formed on a side surface of the third gate structure 310. Additionally, a third recess 332 is formed on the side surface of the third gate structure 310 in the substrate 100. The third gate spacer 320 may be formed together with the third recess 332.

Because the third hard mask 318 includes an etch resistant material in comparison to the third gate spacer 320, a part of the side surface of the third hard mask 318 may not be covered by the third gate spacer 320.

The third hard mask 318 may include silicon nitride, and the third gate spacer 320 may include SiOCN, for example.

The third gate spacer 320 and the third recess 332 may be formed through the etching process, but the third gate electrode 315 is not exposed through the etching process. This is because the third hard mask 318, which includes the etch resistant material in comparison to the third gate spacer 320, entirely covers the third gate electrode 315. That is, because the third hard mask 318 protects the third gate spacer 320 that is formed on the side surface of the third gate electrode 315 from the etching process, the third gate electrode 315 is not exposed.

Figure 23:
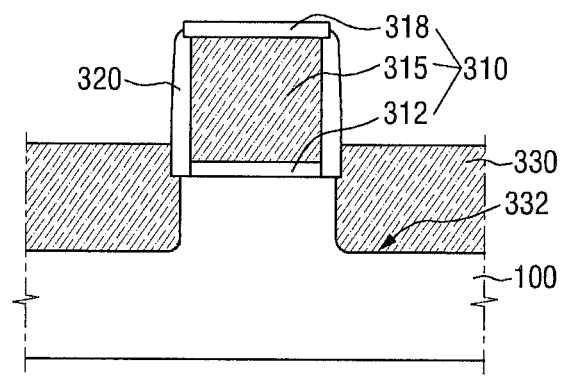

Referring to FIG. 23, a third source/drain 330 is formed in the third recess 332.

Referring to FIG. 23, a semiconductor device that is fabricated according to the fourth embodiment in accordance with principles of inventive concepts will be described. Semiconductor device 2 includes a third gate insulating layer 312, a mask pattern 318, a third gate spacer 320, a third recess 332, and a third source/drain 330.

The third gate electrode 315, a polysilicon gate, is formed on the substrate 100. A mask pattern 318 having a width that is larger than the width of the third gate electrode 315 is arranged on the third gate electrode 315.

The third gate spacer 320 is unable to cover a part of the side surface of the mask pattern 318. A part of the third gate spacer 320 may be curved into a lower portion of the mask pattern 318. That is, the mask pattern 310 overlaps a part of the third gate spacer 320 and the third gate electrode 315.

The third recess 332 is arranged on both sides of the third gate electrode 315 in the substrate 100. The third source/drain 330 is formed in the third recess 332.

Figure 24:
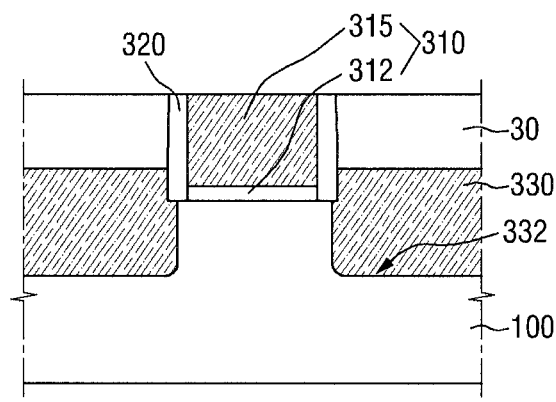
FIGS. 24 and 25 are views of intermediate steps explaining a method for fabricating a semiconductor device according to a fifth embodiment in accordance with principles of inventive concepts.
Figure 25:
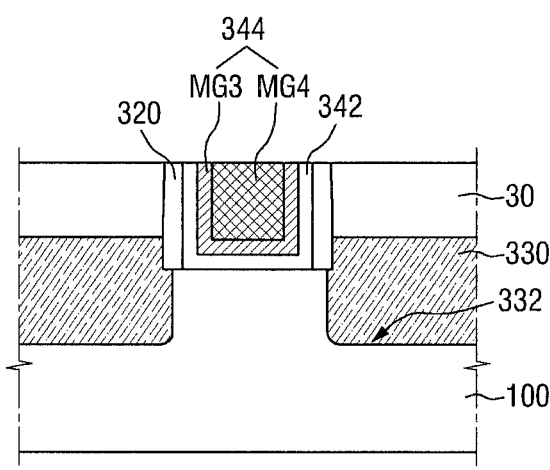

Referring to FIGS. 23 to 25, a method for fabricating a semiconductor device according to a fifth embodiment in accordance with principles of inventive concepts will be described.

FIGS. 24 and 25 are views of intermediate steps explaining a method for fabricating a semiconductor device according to a fifth embodiment in accordance with principles of inventive concepts.

In FIG. 23, the third gate electrode 315 and the third gate insulating layer 312 may be used as a mold for forming a replacement metal gate electrode. Accordingly, in the following description, it is assumed that the third gate electrode 315 and the third gate insulating layer 312 correspond to a mold.

Referring to FIG. 24, a third gate structure 310 and an interlayer insulating layer 30 that covers a third source/drain 330 are formed on a substrate 100.

The interlayer insulating layer 30 may include, for example, at least one of a low-k material layer, an oxide layer, a nitride layer, and an oxynitride layer.

After the interlayer insulating layer 30 is formed, the interlayer insulating layer 30 is planarized to expose the third gate electrode 315. That is, in the fifth embodiment in accordance with principles of inventive concepts, the third gate electrode 315, which is used as a mold for forming a replacement metal gate electrode, is exposed.

Through the planarization process for exposing the third gate electrode 315, the third hard mask 318, which has a width that is larger than the width of the third gate electrode 315, is removed. Additionally, a part of the third gate electrode 315 may be removed through the planarization process.

Referring to FIG. 25, a second trench 320t is formed in the interlayer insulating layer 30 through removal of the third gate electrode 315 and the third gate insulating layer 312.

Then, a third replacement gate insulating layer 342 and a third replacement gate electrode 344 are formed in the second trench 320t.

The third replacement gate insulating layer 342 may be conformally formed along the side wall and the lower surface of the second trench 320t. The third replacement gate insulating layer 342 may include a high-k dielectric layer having higher dielectric constant than the silicon oxide layer.

The third replacement gate electrode 344 may include metal layers MG3 and MG4. As illustrated, in accordance with principles of inventive concepts, the third replacement gate electrode 344 may be formed by stacking two or more metal layers MG3 and MG4. The third metal layer MG3 may serve to adjust work function, and the fourth metal layer MG4 may serve to fill a space that is formed by the third metal layer MG3.

As described through FIG. 19, the fourth metal layer MG4 of the third replacement gate electrode 344 may be omitted.

Referring to FIGS. 26 to 33, a method for fabricating a semiconductor device according to a sixth embodiment in accordance with principles of inventive concepts will be described.

FIGS. 26 to 33 are views of intermediate steps explaining a method for fabricating a semiconductor device according to a sixth embodiment in accordance with principles of inventive concepts.

Figure 26:
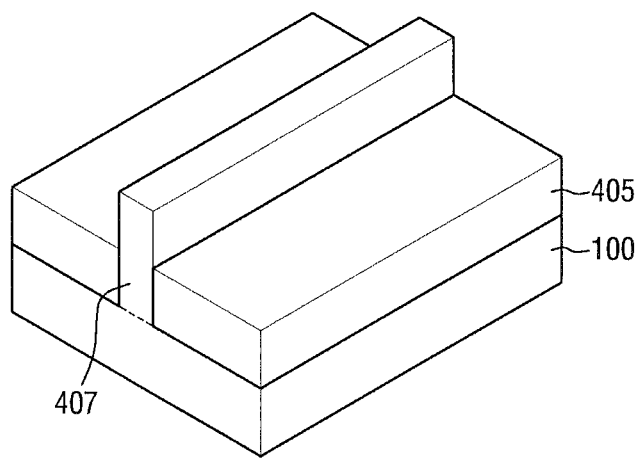
FIGS. 26 to 33 are views of intermediate steps explaining a method for fabricating a semiconductor device according to a sixth embodiment in accordance with principles of inventive concepts.

Referring to FIG. 26, in accordance with principles of inventive concepts, a fin-type active pattern 407 is formed on a substrate 100. The substrate 100 may include the fin-type active pattern 407 that projects above the substrate 100.

The fin-type active pattern 407 may extent long along a second direction Y. The fin-type active pattern 407 may be a portion that is formed by etching a part of the substrate 100, or may include an epitaxial layer that is grown from the substrate 100. A field insulating layer 405 may cover a part of the side surface of the fin-type active pattern 407. That is, the fin-type active pattern 407 may project above the field insulating layer 405.

The fin-type active pattern 407 may include an elemental semiconductor material such as silicon or germanium, for example. Additionally, the fin-type active pattern 407 may include compound semiconductor, for example, IV-IV group compound semiconductor or III-V group compound semiconductor. Specifically, as an example of IV-IV group compound semiconductor, the fin-type active pattern 407 may be a binary or ternary compound, which includes at least two of carbon (C), silicon (Si), germanium (Ge), and tin (Sn), or a compound that is the binary or ternary compound doped with IV group elements. As an example of III-V group compound semiconductor, the fin-type active pattern 407 may be a binary, ternary, or quaternary compound, which is formed by combining at least one of III group elements, such as aluminum (Al), gallium (Ga), and indium (In) and one of V group elements, such as phosphorous (P), arsenide (As), and antimonium (Sb).

Figure 27:
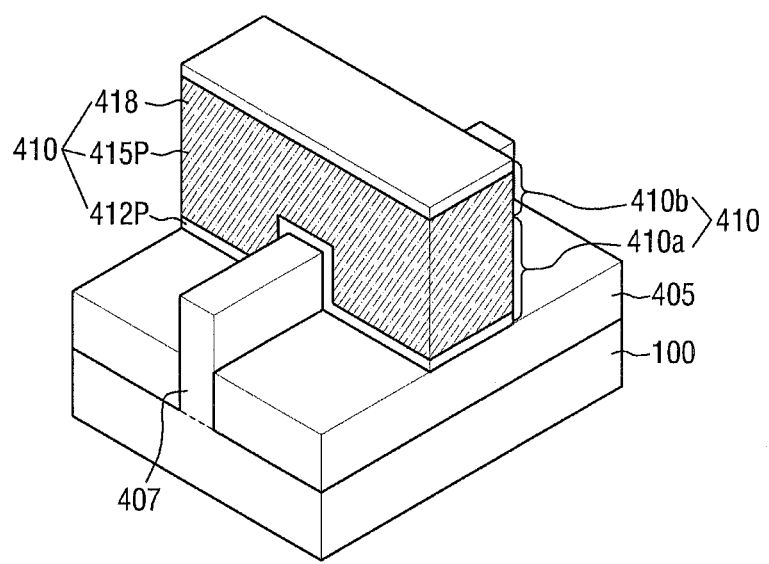

Referring to FIG. 27, a fourth gate structure 410 that crosses the fin-type active pattern 407 is formed on the fin-type active pattern 407. The fourth gate structure 410 is formed to extend in a first direction X.

The fourth gate structure 410 includes a second dummy gate insulating layer 412p, a second dummy silicon gate 415p, and a fourth hard mask 418. The second dummy gate insulating layer 412p may include, for example, one of silicon oxide (SiO2), silicon oxynitride (SiON), and a combination thereof. The second dummy silicon gate 415p may include, for example, polysilicon. The fourth hard mask 418 may include, for example, silicon nitride (SiN), however exemplary embodiments in accordance with principles of inventive concepts are not limited thereto.

In exemplary embodiments in accordance with principles of inventive concepts, fourth gate structure 410 is formed through performing an etching process using the fourth hard mask 418. In the etching process for forming the fourth gate structure 410, side surfaces of the second dummy gate insulating layer 412p and the second dummy silicon gate 415p are passivated, and thus, lateral etching, which etches the side surfaces of the second dummy gate insulating layer 412p and the second dummy silicon gate 415p, can be minimized.

The fourth gate structure 410 includes a lower portion 410a of the fourth gate structure and an upper portion 410b of the fourth gate structure. The lower portion 410a of the fourth gate structure entirely surrounds the fin-type active pattern 407. In other words, the height of the lower portion 410a of the fourth gate structure that which is measured from the upper surface of the field insulating layer 405 is higher than the height of the fin-type active pattern 407 that projects above the field insulating layer 405.

The cross section that is obtained by cutting the fin-type active pattern 407 and the fourth gate structure 410 along the second direction Y is similar to the cross section of FIG. 15.

Figure 28:
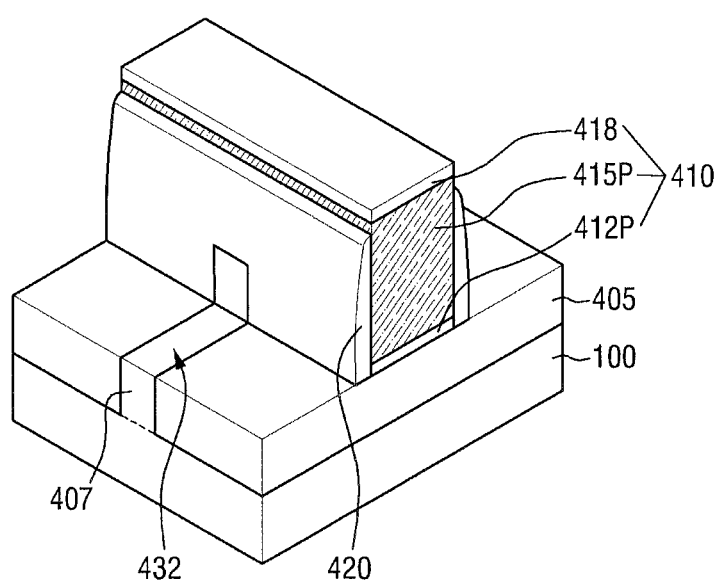

Referring to FIG. 28, a fourth gate spacer 420 is formed on the side surface of the fourth gate structure 410. Additionally, a fourth recess 432 is formed on a side surface of the fourth gate structure 40 in the fin-type active pattern 407.

The fourth gate spacer 420 may include a material having lower etch resistance than the fourth hard mask 418, and for example, SiOCN that is a low-k material.

The height of the fourth gate spacer 420 that is measured from the upper surface of the field insulating layer 405 may be lower than the height that is measured from the upper surface of the field insulating layer 405 to the upper surface of the fourth gate structure 410, that is, to the upper surface of the fourth hard mask 418. This is because the fourth hard mask 418 includes the etch resistant material in comparison to the fourth gate spacer 420.

For example, the fourth gate spacer 420 may be unable to cover a part of the side surface of the second dummy silicon gate 415p. That is, after the etching process for forming the fourth recess 432, the second dummy silicon gate 415p may be exposed by the fourth gate spacer 420.

When, the fourth gate spacer 420 is formed on the side surface of the fourth gate structure 410, a fin spacer may be formed even on the side surface of the fin-type active pattern 407 that does not overlap the fourth gate structure 410. In order to form the fourth recess 432 in the fin-type active pattern 407, the fin spacer that is formed on the side surface of the fin-type active pattern 407 may be removed. While the fin spacer that is formed on the side surface of the fin-type active pattern 407, the height of the fourth gate spacer 420 is lowered, and a part of the hard mask is removed.

In this case, because the fourth hard mask 418 includes the etch resistant material in comparison to the fourth gate spacer 420, the thickness with which the fourth hard mask 418 is removed becomes lower than the height with which the fourth gate spacer 420 is removed.

Through such a process, the height of the fourth gate spacer 420 becomes lower than the height of the fourth gate structure 410, and a part of the second dummy silicon gate 415p may be exposed.

In the case of illustrating the first gate electrode 115 as one layer, the cross section that is obtained by cutting the fin-type active pattern 407 and the fourth gate structure 410 along the second direction Y is similar to the cross section of FIG. 10.

Figure 29:
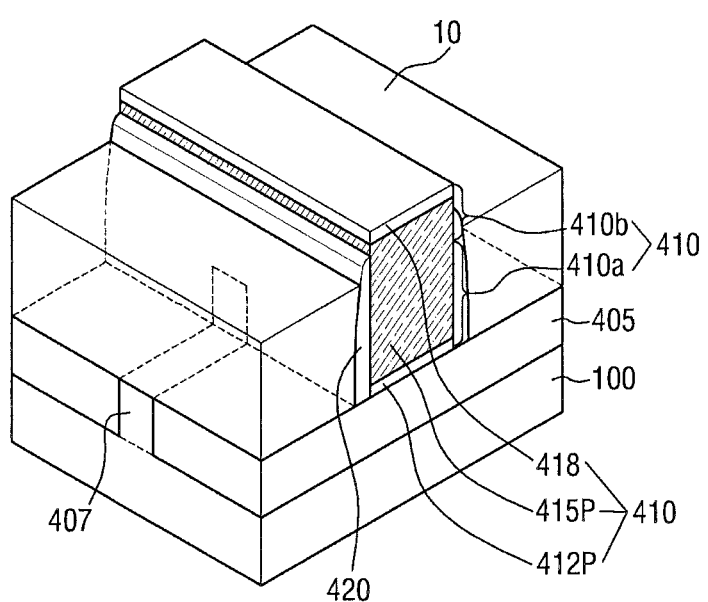

Referring to FIG. 29, a sacrificial layer 10, which surrounds a part of the fourth gate spacer 420 and the lower portion 410a of the fourth gate structure, is formed on the substrate 100. Because the fourth recess 432 is formed in the fin-type active pattern 407, the sacrificial layer 10 fills the fourth recess 432.

Because the sacrificial layer 10 surrounds the lower portion 410a of the fourth gate structure, the height that is measured from the substrate 100 to the upper surface of the sacrificial layer 10 is higher than the height that is measured from the substrate 100 to the upper surface of the fin-type active pattern 407. That is, based on the upper surface of the field insulating layer 405, the height of the sacrificial layer 10 is higher than the height of the fin-type active pattern 407 that projects above the field insulating layer 405.

In the case of illustrating the first gate electrode 115 as one layer, the cross section that is obtained by cutting the fin-type active pattern 407 and the fourth gate structure 410 along the second direction Y is similar to the cross section of FIG. 11.

Figure 30:
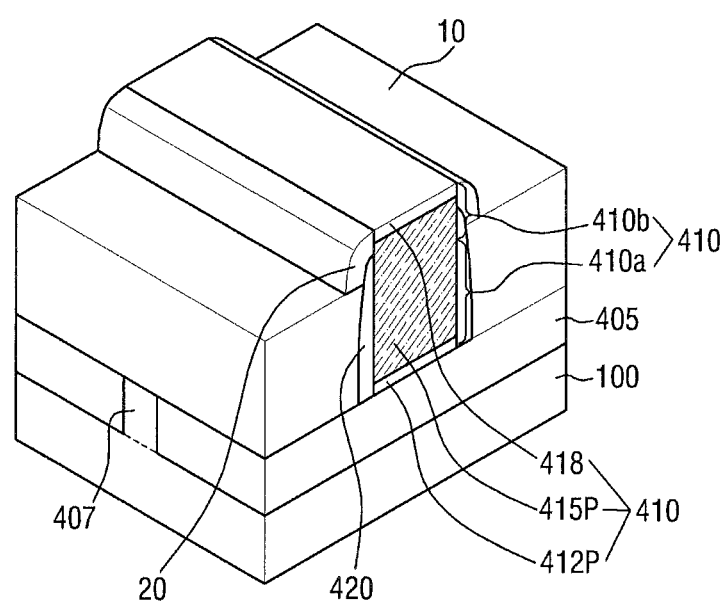

Referring to FIG. 30, a capping spacer 20 is formed on a side surface of the upper portion 410b of the fourth gate structure that projects above the sacrificial layer 10. Like the fourth gate structure 410, the capping spacer 20 is formed to extend in the first direction X.

The capping spacer 20 is formed not only on the side surface of the fourth gate spacer 420 that projects above the sacrificial layer 10 but also on the side surface of the fourth hard mask 418 that is not covered by the fourth gate spacer 420 and the side surface of a part of the second dummy silicon gate 415p. That is, the fourth gate spacer 420 and the capping spacer 20 are continuously formed on the side surface of the fourth gate structure 410.

In the case of illustrating the first gate electrode 115 as one layer, the cross section that is obtained by cutting the fin-type active pattern 407 and the fourth gate structure 410 along the second direction Y is similar to the cross section of FIG. 12.

Figure 31:
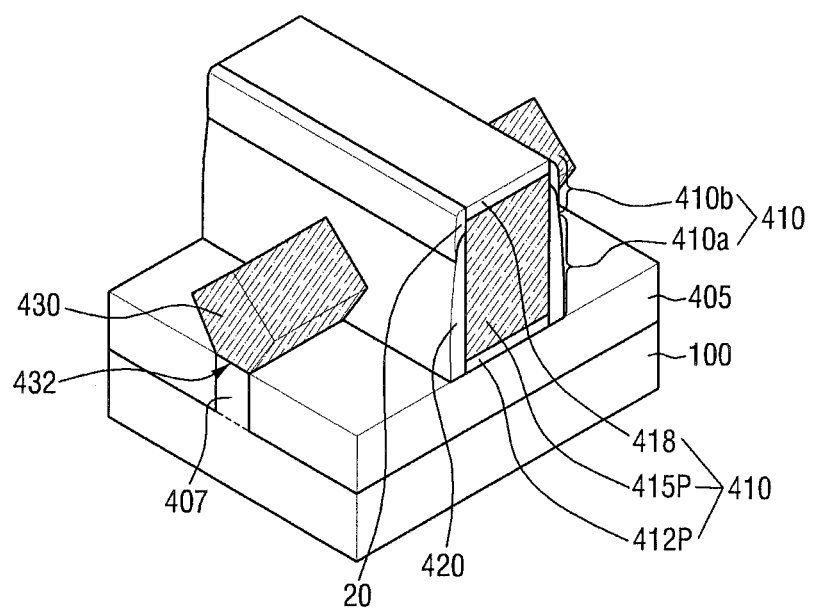

Referring to FIG. 31, the field insulating layer 405 is exposed through removal of the sacrificial layer 10 that surrounds the lower portion 410a of the fourth gate structure. Because the sacrificial layer 10 is removed, the fourth recess 432 is exposed.

Then, at least a part of the capping spacer 20 that projects from the side surface of the fourth gate spacer 420 and the side surface of the fourth hard mask 418 may be etched.

By etching at least a part of the projecting capping spacer 20, the side surface of the capping spacer 20 and the side surface of the fourth gate spacer 420 may have continuous profiles, for example.

Then, a fourth source/drain 430 may be formed in the fourth recess 432. The fourth source/drain 430 is formed on the side surface of the fourth gate structure 410 and on the fin-type active pattern 407. The cross section that is obtained by cutting the fin-type active pattern 407 and the fourth gate structure 410 along the second direction Y is similar to the cross section of FIG. 14.

Because the capping spacer 20 is formed on the side surface of dummy silicon gate 415p, the side surface of dummy silicon gate 415p is not exposed and a method in accordance with principles of inventive concepts may prevent the unwanted growth of a semiconductor pattern, such as a parasitic pattern such as a nodule defect, during a subsequent processing step, such as an epitaxial growth step. Such a step may be employed in the formation of a source/drain region, for example. A nodule defect such as may be prevented by a method in accordance with principles of inventive concepts may reduce semiconductor device performance and yield and, by preventing it, a semiconductor device formation method in accordance with principles of inventive concepts may increase both device performance and yield.

Figure 32:
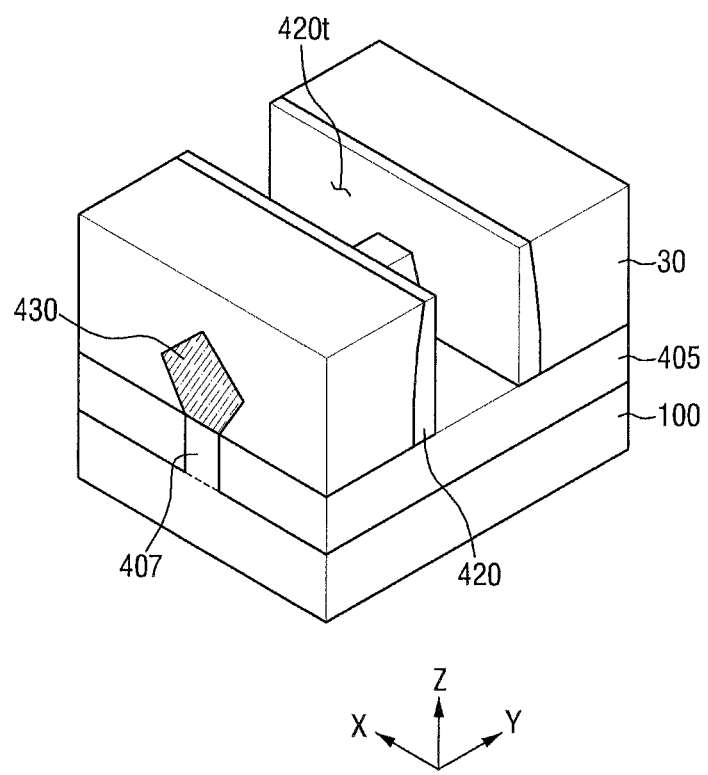

Referring to FIG. 32, an interlayer insulating layer 30, which covers the fourth gate structure 410 and the fourth source/drain 430, is formed on the substrate 100.

After the interlayer insulating layer 30 is formed, the interlayer insulating layer 30 is planarized to expose the second dummy silicon gate 415p. That is, the second dummy silicon gate 415p that includes polysilicon is exposed. Through the planarization process for exposing the second dummy silicon gate 415p, the fourth hard mask 418 and the capping spacer 20 are removed.

Then, a third trench 420t is formed in the interlayer insulating layer 30 through removal of the second dummy silicon gate 415p and the second dummy gate insulating layer 412p.

A part of the fin-type active pattern 407 that is used as a channel region of the semiconductor device may be exposed through the third trench 420t.

Figure 33:
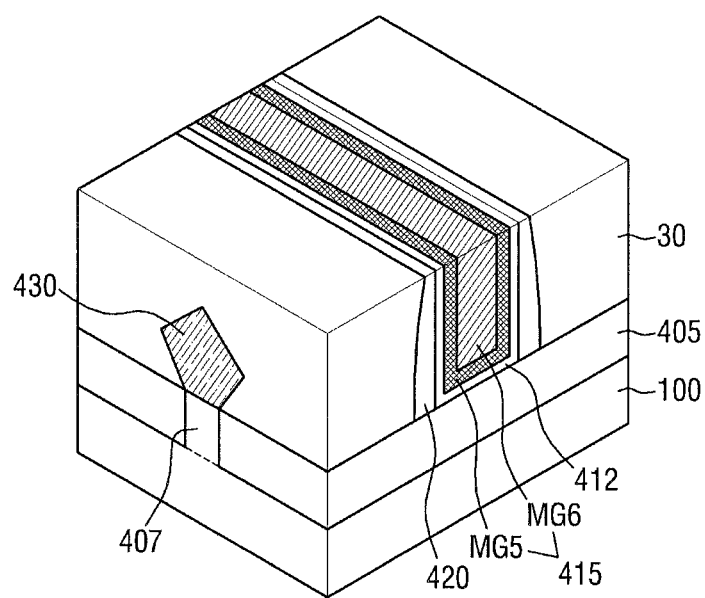

Referring to FIG. 33, a fourth gate insulating layer 412 and a fourth gate electrode 415 are formed in the third trench 420t.

The fourth gate insulating layer 412 may be conformally formed along the side wall and the lower surface of the third trench 420t. The fourth gate insulating layer 412 may include a high-k dielectric layer having higher dielectric constant than the silicon oxide layer.

The fourth gate electrode 415 may include metal layers MG5 and MG6. Fourth gate electrode 415 may be formed by stacking two or more metal layers MG5 and MG6. The fifth metal layer MG5 may serve to adjust work function, and the sixth metal layer MG6 may serve to fill a space that is formed by the fifth metal layer MG5. However, if the width of the third trench 420t is narrow, the sixth metal layer MG6 of the fourth gate electrode 415 may be omitted.

In the method for fabricating a semiconductor device according to the sixth embodiment in accordance with principles of inventive concepts, it has been described that the fourth recess 432 is formed before the capping spacer 20 is formed. However, the forming of the fourth recess 432 is not limited thereto, and as described above with reference to FIGS. 1 to 9, the fourth recess 432 may be formed after the capping spacer 20 is formed.

Figure 34:
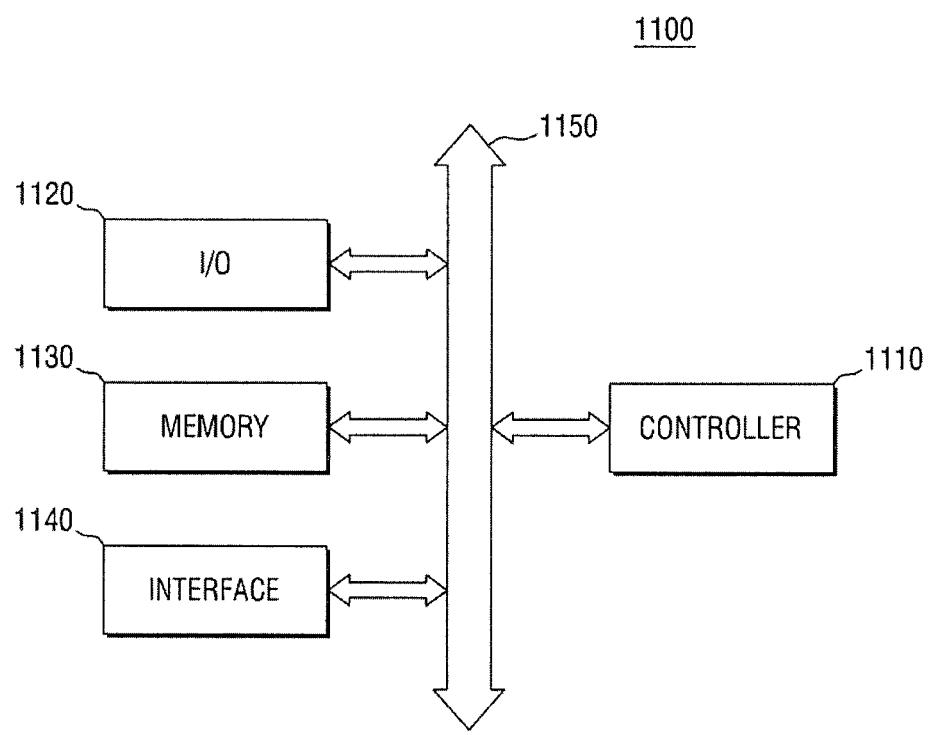
FIG. 34 is a block diagram of an electronic system including a semiconductor device fabricated according to embodiments in accordance with principles of inventive concepts.

FIG. 34 is a block diagram of an electronic system including a semiconductor device fabricated according to embodiments in accordance with principles of inventive concepts.

Referring to FIG. 34, an electronic system 1100 according to the embodiments in accordance with principles of inventive concepts may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that can perform similar functions. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. Although not illustrated, the electronic system 1100 may additionally include a high-speed DRAM and/or SRAM as an operating memory for improving the operation of the controller 1110. The semiconductor device according to embodiments in accordance with principles of inventive concepts may be provided inside the memory 1130 or may be provided as a part of the controller 1110 or the I/O device 1120.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 35:
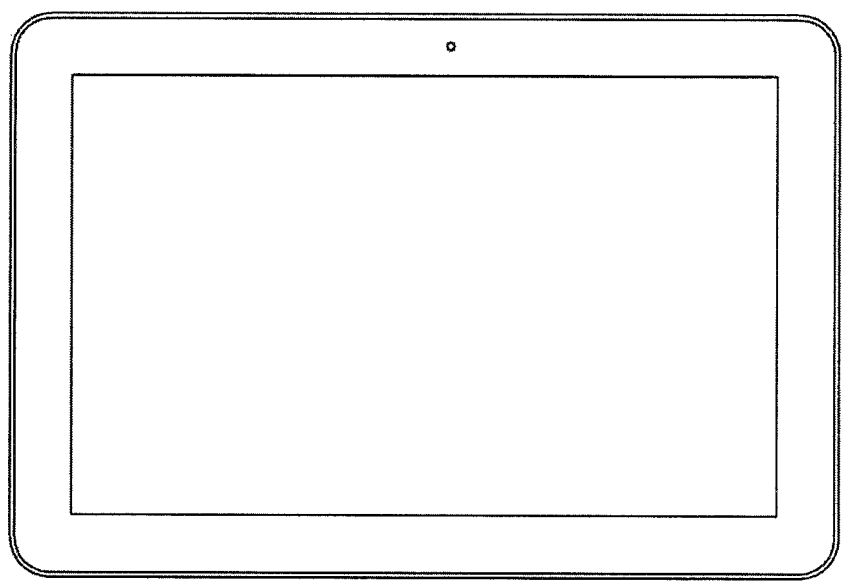
FIGS. 35 and 36 are exemplary views illustrating a semiconductor system to which a semiconductor device fabricated according to embodiments in accordance with principles of inventive concepts can be applied.
Figure 36:
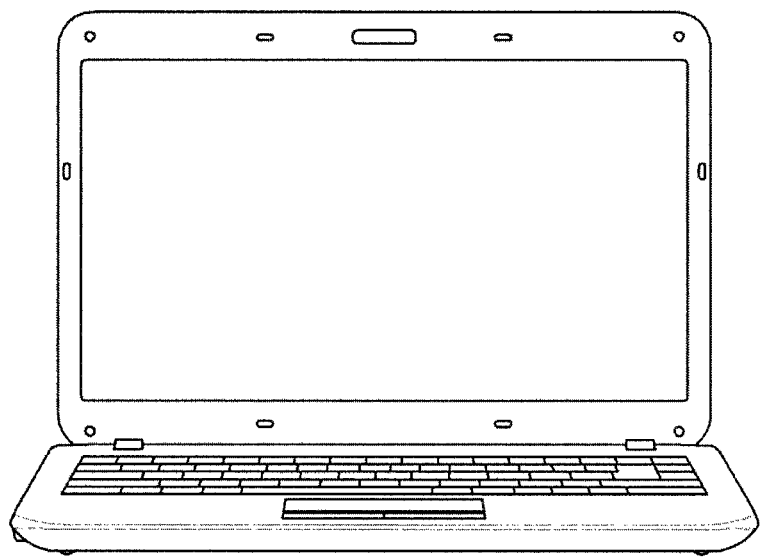

FIGS. 35 and 36 are exemplary views illustrating a semiconductor system to which a semiconductor device fabricated according to embodiments in accordance with principles of inventive concepts can be applied. FIG. 35 illustrates a tablet PC, and FIG. 36 illustrates a notebook PC. The semiconductor devices fabricated according to the embodiments in accordance with principles of inventive concepts may be used in the tablet PC or the notebook PC. It is apparent to those of skilled in the art that the semiconductor device fabricated according to some embodiments in accordance with principles of inventive concepts can be applied even to other integrated circuit devices that have not been exemplified.

Although exemplary embodiments in accordance with principles of inventive concepts have been described for illustrative purposes, those skilled in the art will appreciate that various modifications, additions and substitutions are possible, without departing from the scope and spirit of inventive concepts as disclosed in the accompanying claims.

What is claimed is:

1. A method for fabricating a semiconductor device comprising:
    forming a gate structure, in which a polysilicon gate and a hard mask are stacked and which includes an upper portion and a lower portion, on a substrate;
    forming a gate spacer on a side surface of the gate structure;
    forming a sacrificial layer, which surrounds a part of the gate spacer and the lower portion of the gate structure, on the substrate;
    forming a capping spacer on a side surface of the upper portion of the gate structure that projects beyond the sacrificial layer; and
    removing the sacrificial layer after forming the capping spacer.

2. The method of claim 1, wherein the capping spacer projects farther than a side surface of the gate spacer.

3. The method of claim 2, further comprising etching at least a part of the projecting capping spacer after removing the sacrificial layer.

4. The method of claim 1, wherein the capping spacer is formed to extend up to at least a part of a side surface of the polysilicon gate.

5. The method of claim 1, wherein the forming the capping spacer comprises
    forming a capping spacer layer on an upper surface of the sacrificial layer and the gate structure; and
    exposing the sacrificial layer by etching the capping spacer layer.

6. The method of claim 5, wherein the capping spacer layer includes at least one of SiO2, SiN, and SiOCN.

7. The method of claim 1, further comprising forming a recess at each side of the gate spacer in the substrate before forming the sacrificial layer.

8. The method of claim 7, wherein a height of the gate structure is higher than a height of the gate spacer.

9. The method of claim 1, further comprising forming a recess at each side of the gate spacer in the substrate after removing the sacrificial layer.

10. The method of claim 1, further comprising:
    forming an interlayer insulating layer, which covers the gate structure and the capping spacer, on the substrate after removing the sacrificial layer;
    exposing the polysilicon gate by planarization of the interlayer insulating layer;
    forming a trench in the interlayer insulating layer by removing the polysilicon gate; and
    forming a replacement gate electrode in the trench.

11. The method of claim 10, wherein the substrate includes a fin-type active pattern that projects above the substrate, and
    the gate structure is formed on the fin-type active pattern to cross the fin-type active pattern.

12. The method of claim 11, wherein a height measured from the substrate to an upper surface of the sacrificial layer is higher than a height measured from the substrate to an upper surface of the fin-type active pattern.

13. The method of claim 1, wherein the gate spacer and the hard mask include materials having different etch resistances, and
    the gate spacer includes SiOCN, and the hard mask includes SiN.

14. A method of fabricating a semiconductor device, comprising:
    forming a gate structure including a polysilicon gate with a hard mask formed thereon;
    forming gate spacers extending along the entire side surfaces of the gate structure, including side surfaces of the hard mask; and
    forming a capping layer on upper side surfaces of the gate spacers, including portions of the upper side surfaces of the gate spacers that extend along side surfaces of the hard mask to prevent parasitic epitaxial growth,
    wherein the gate spacers only partially cover the sides of the polysilicon and the capping layer covers whatever portion of the sides not covered by the gate spacers.

15. The method of claim 14 further comprising performing an epitaxial growth step to form a source/drain region.

16. The method of claim 14 wherein the capping layer is formed to prevent exposure of the polysilicon during a subsequent process step.

17. The method of claim 14 further comprising:
    forming an interlayer insulating layer, which covers the gate structure and the capping spacer, on the substrate after removing the sacrificial layer;
    exposing the polysilicon gate by planarization of the interlayer insulating layer;
    forming a trench in the interlayer insulating layer by removing the polysilicon gate;
    forming a replacement gate electrode in the trench, wherein the substrate includes a fin-type active pattern that projects above the substrate, and
    the gate structure is formed on the fin-type active pattern to cross the fin-type active pattern.

18. A method of fabricating a semiconductor device, comprising:
    forming a gate structure including a polysilicon gate with a hard mask formed thereon;
    forming gate spacers extending along the entire side surfaces of the gate structure, including side surfaces of the hard mask; and
    forming a capping layer on upper side surfaces of the gate spacers, including portions of the upper side surfaces of the gate spacers that extend along side surfaces of the hard mask to prevent parasitic epitaxial growth;

wherein the hard mask has a width that is larger than a width of the polysilicon gate, the method further comprising:

forming a recess at each side of the gate structure, in a substrate; and forming a source/drain in the recess.

19. The method of claim 18, wherein the forming the gate structure comprises:

forming a polysilicon layer and the hard mask on the substrate, and forming the polysilicon gate using the hard mask as a mask in an etching process, wherein the polysilicon gate is undercut beneath the hard mask in the etching process.

* * * * *